United States Patent
Harres

(10) Patent No.: US 7,573,311 B2
(45) Date of Patent: Aug. 11, 2009

(54) PROGRAMMABLE HIGH-RESOLUTION PHASE DELAY

(75) Inventor: Daniel N. Harres, Belleville, IL (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 11/933,645

(22) Filed: Nov. 1, 2007

(65) Prior Publication Data

US 2009/0115476 A1 May 7, 2009

(51) Int. Cl.
*H03K 3/00* (2006.01)

(52) U.S. Cl. .................. 327/231; 327/158; 327/234; 327/243

(58) Field of Classification Search .............. None
See application file for complete search history.

(56) References Cited

U.S. PATENT DOCUMENTS

| 5,907,253 | A  | * | 5/1999  | Davis et al. .............. 327/156 |
| 6,188,261 | B1 |   | 2/2001  | Nosaka et al. |
| 6,351,154 | B2 | * | 2/2002  | Brachmann et al. .......... 327/12 |
| 6,452,425 | B1 | * | 9/2002  | Gregorian et al. ............ 327/99 |
| 7,161,402 | B1 |   | 1/2007  | Sompur et al. |
| 2005/0110979 | A1 |  | 5/2005  | Harres |
| 2005/0254038 | A1 |  | 11/2005 | Harres |
| 2006/0232765 | A1 |  | 10/2006 | Harres |
| 2007/0030041 | A1 |  | 2/2007  | Huang et al. |
| 2007/0147844 | A1 |  | 6/2007  | Harres |
| 2007/0262801 | A1 | * | 11/2007 | Renaud et al. .............. 327/172 |

* cited by examiner

*Primary Examiner*—An T Luu
(74) *Attorney, Agent, or Firm*—Yee & Associates, P.C.; Kevin G. Fields

(57) ABSTRACT

A programmable delay lock loop system provides a delayed output signal having a programmed delay from an input signal. A phase detector provides a phase delay signal indicative of an actual phase difference between the input signal and the delayed output signal. An accumulator provides a delay command signal as a function of a difference between a commanded delay and the actual phase difference. A programmable phase delay circuit is configured to generate a ramp signal based upon the input signal, to adjust the ramp signal with respect to a threshold level in response to the delay command signal, to generate a trigger signal based upon a comparison of the ramp signal with the threshold level, and to clock the delayed output signal in response to the trigger signal.

19 Claims, 3 Drawing Sheets

PROGRAMMABLE HIGH-RESOLUTION PHASE DELAY

TECHNICAL FIELD

The embodiments described herein generally relate to phase delay circuits and techniques. More particularly, the embodiments relate to phase delays used in electronic circuits and devices.

BACKGROUND

Phase delay circuits are widely used in a number of electric, electronic and opto-electronic environments. Digital phase delay circuits, for example, are commonly used to produce finely-controlled clock signals, modulation signals, demodulation signals and the like in a variety of settings and applications. Conventional optical phase domain reflectometer (OPDR) devices, for example, typically inject light into optical fibers under test and then measure the phasing of light reflected back from the fiber to ascertain certain characteristics (e.g. attenuation, fiber length, distance breaks in the fiber, etc.) of the fiber under test. In such devices, it is generally desirable to precisely control the phasing of the digital signals used in modulating and demodulating the light propagating in the fiber. A digital phase delay circuit may therefore be used to produce modulation and demodulation signals that are similar to each other, yet delayed very slightly in time. Many other optical, electronic and electronic devices use other forms of phase delay for widely varying purposes.

Generally speaking, engineers are continually striving to reduce the cost, weight and power consumption of various products; this is especially true in aerospace settings, as well as in homeland defense and other governmental settings. In the case of unmanned aerial vehicles (UAVs), for example, it may be desirable to deploy a number of OPDR and/or other reflectometer devices throughout the vehicle to quickly and accurately identify any breaks or other issues in optical fibers used in collision avoidance, control and/or other systems operating on the vehicle. In such settings it would be highly desirable to produce digital phase delay circuits that are not only highly accurate and programmable, but that are also relatively low-cost and efficient in terms of size, weight and power (SWAP). A low cost and low SWAP delay circuit could have wide application in numerous other devices and settings as well.

BRIEF SUMMARY

According to various embodiments, a digital delay circuit is provided that is capable of producing high-resolution phase delays with relatively low cost, weight, size and power consumption. In one embodiment, a programmable delay lock loop system provides a delayed output signal having a programmed delay from an input signal. A phase detector provides a phase delay signal indicative of an actual phase difference between the input signal and the delayed output signal. An accumulator provides a delay command signal as a function of a difference between a commanded delay and the actual phase difference. A programmable phase delay circuit is configured to generate a ramp signal based upon the input signal, to adjust the ramp signal with respect to a threshold level in response to the delay command signal, to generate a trigger signal based upon a comparison of the ramp signal with the threshold level, and to clock the delayed output signal in response to the trigger signal.

In other embodiments, a circuit is configured to produce a programmable phase delay responsive to a command signal in an input signal having a frequency. The circuit comprises a ramp generating circuit configured to produce a ramp waveform having a ramp frequency that is based upon the frequency of the input signal. A scaling circuit is configured to adjust the amplitude of the ramp waveform in response to the command signal, and a comparator is configured to receive the ramp waveform and to produce a trigger signal that is based upon a comparison of the ramp waveform to a threshold level. A delay circuit has a clock input configured to receive the trigger signal, and to produce a signal output that is a delayed representation of the input signal clocked in response to the trigger signal.

In still other embodiments, a method of creating a delayed digital signal that differs from an input signal having a frequency by a programmable amount of delay is provided. A ramp signal is produced that has a ramp signal frequency based upon the frequency of the input signal and an amplitude bias that is based upon the programmable amount of delay. The ramp signal is compared to a reference value to create a delayed trigger signal based upon the whether the ramp signal is greater than or less than the reference value. The trigger signal is then applied as a clock to thereby create the delayed digital signal.

BRIEF DESCRIPTION OF THE DRAWINGS

Various embodiments will hereinafter be described in conjunction with the following drawing figures, wherein like numerals denote like elements.

DETAILED DESCRIPTION

The following detailed description is merely exemplary in nature and is not intended to limit the described embodiments or the application and uses of the described embodiments. Furthermore, there is no intention to be bound by any expressed or implied theory presented in the preceding technical field, background, brief summary or the following detailed description.

As described in more detail below, a high resolution digital delay can be created by exploiting aspects of both digital and analog circuitry. The resulting delay can be finely controlled with a digital signal processor or other conventional device, yet the circuitry used to create the delayed signal can be constructed from relatively low-size and low-weight components such as conventional analog components, integrated circuitry and/or the like. In some embodiments, delay between the input and output signals can be controlled to resolutions on the order several nanoseconds or so, or even less; as a result, a finely-controlled delay can be produced. Moreover, it has been discovered that some embodiments consume very small amounts of electrical power in comparison to commercially-available delay circuits, at a fraction of the cost of such circuits. As a result, a programmable digital delay circuit and technique can be widely used in any number of commercial applications and settings, including any sort of optical, opto-electronic, electronic and/or other phase-sensitive applications, including any sort of time or phase domain reflectometry or the like.

Figure 1:
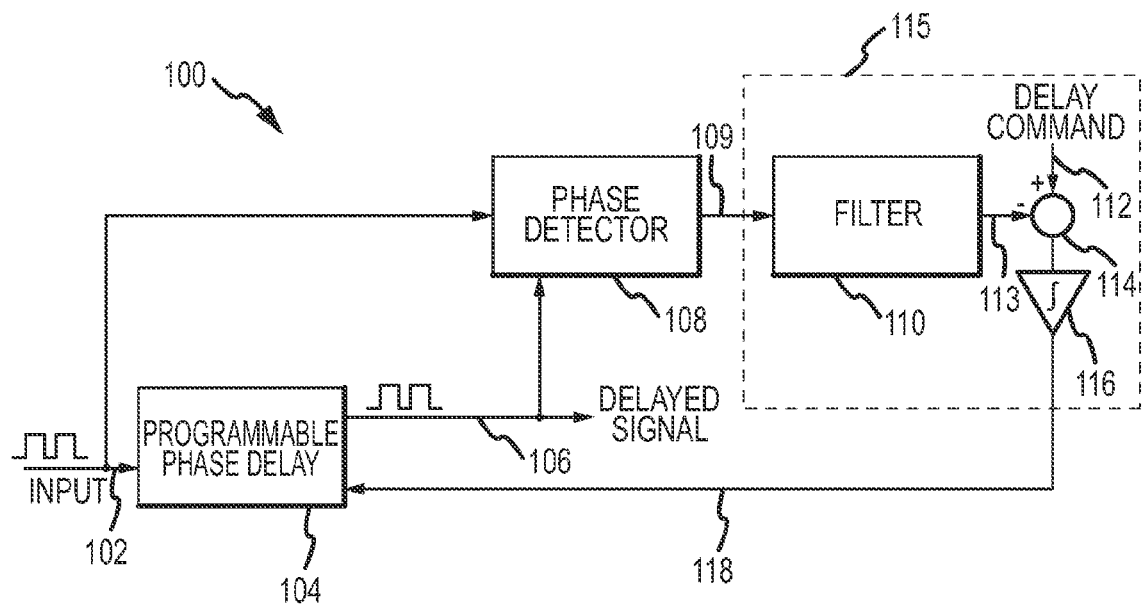
FIG. 1 is a block diagram of an exemplary phase control circuit.

With initial reference to FIG. 1, an exemplary delay lock loop system 100 suitably includes a phase detector 108, an accumulator 116 and a programmable phase delay circuit 104 as appropriate. Phase delay circuit 104 is able to create a programmed delay between an input signal 102 and a delayed signal 106 in response to a delay adjust signal 118. As shown in FIG. 1, the actual phase difference 109 between signals 102 and 106 can be detected by phase detector 108, and the resulting data can be accumulated with delay commands 112 to adjust the delay using conventional feedback and control techniques.

Figure 2:
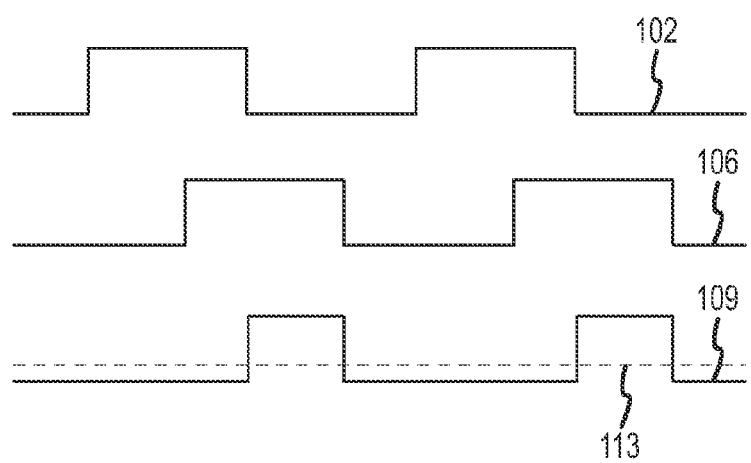
FIG. 2 is a timing diagram showing the operation of an exemplary phase control circuit.

Phase detector 108 is any circuit, device, module or other logic capable of detecting a difference in phase between signals 102 and 106. In various embodiments, phase detector 108 provides a conventional exclusive-OR result based upon the two signals 102 and 106. Phase detector 108 may therefore be implemented using a XOR gate, or any other device or other circuit constructed from discrete and/or integrated circuitry. In other embodiments, phase detector 108 is implemented in digital logic executing within any sort of controller or digital signal processor using conventional XOR logic or the like. Phase detector 108 provides a phase delay signal 109, which is any analog or digital indication of the actual difference in phase between signals 102 and 106. This signal 109, in turn, can be accumulated or otherwise used to control the amount of delay between signals 102 and 106. Additional detail about phase delay signal 109 is provided below in the discussion of FIG. 2.

In various embodiments, the amount of delay produced between signals 102 and 106 is controlled by any sort of digital processor 115, such as any sort of microcontroller, microprocessor, digital signal processor, programmed array and/or the like. In such embodiments, various functions and features can be implemented using conventional programming constructs embodied in any type of source or object code stored in digital memory, mass storage and/or the like. In the embodiment shown in FIG. 1, for example, processor 115 is shown to include a filter module 110, an adder module 114 and a digital accumulator 116. Each of these modules can be formulated using conventional logic embodied in hardware, software, firmware and/or the like and stored in any memory or other media.

In one embodiment, the duty cycle of signal 109 can be indicative of an amount of delay using a sort of pulse width modulation technique. With momentary reference to FIG. 2, phase delay signal 109 is an XOR or other result that indicates the amount of phase difference between input signal 102 and output signal 106. In general, the duty cycle of signal 109 is indicative of the amount of phase difference between the two signals 102, 106. That is, if signals 102 and 106 are perfectly in phase, the XOR result identified in signal 109 from phase detector 108 will be essentially flat. As the signals 102 and 106 become more out of phase, the XOR result in signal 109 will have increasing duty-cycle in the non-flat state (e.g. returning a non-zero result in FIG. 2) due to the different values of the out-of-phase signals.

With primary reference again to FIG. 1, filter 110 is any digital or other logic capable of converting the phase delay signal 109 to a quantity 113 that can be processed along with delay command 112. In various embodiments, filter 110 produces a DC level or other value 113 that represents the amount of delay present between signals 102 and 106. This value may be ascertained in any manner from phase delay signal 109. Using conventional pulse-width modulation techniques, for example, the duty cycle of signal 109 can be readily converted to a DC value or other scalar value 109 that can be used in subsequent processing.

The filtered result 113 can be compared with the delay command 112 in any manner. In various embodiments, the difference between the filtered result 113 and the commanded delay 112 used to adjust the amount of delay applied by phase delay circuit 104. This difference is logically represented by summing block 114 in FIG. 1. In practice, the values representing command 112 and result 113 can be simply added, subtracted and/or otherwise collected in accumulator 116, which may be implemented using one or more registers, memory addresses and/or other data processing features of processor 115. The accumulated differences between the commanded and resulting delays can be further used to adjust the amount of delay produced in circuit 104 through the use of delay adjust signal 118, as described more fully below.

As noted above, FIG. 1 shows filter 110 and accumulator 116 implemented in digital logic executing within a digital controller 115. In other embodiments, however, some or all of the features shown in FIG. 1 may be implemented in separate logic, including any sort of analog circuitry apart from processor 115. Filter 110 could be equivalently formulated as an analog filter that produces a DC voltage, for example, and/or accumulator 116 could be implemented with a capacitor or other analog integrator capable of storing electrical charge or any other representation of desired delay to be produced by phase delay circuit 104. To that end, appropriate analog-to-digital and/or digital-to-analog circuitry may be provided such that any signals and components present within system 100 may be implemented in any discrete or integrated manner using any sort of digital or analog circuitry and/or other logic as appropriate.

In operation, then, system 100 is able to produce highly-controllable delay between signals 102 and 106 using programmable delay circuit 104. The amount of delay between signals 102 and 106 is adjusted in response to signal 118, which is generated using conventional feedback and control principles that can be executed at least in part on a digital processor 115 based upon the actual amount of delay 109 present between signals 102, 106 and a desired amount of delay 112 that is externally commanded.

Figure 3:
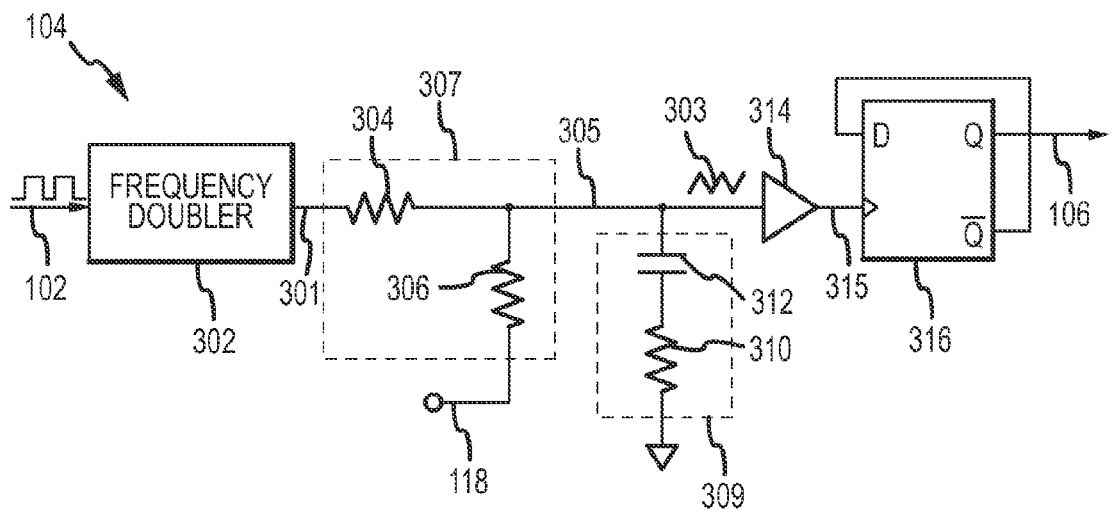
FIG. 3 is a circuit diagram of an exemplary programmable phase delay circuit.

With reference now to FIG. 3, an exemplary programmable phase delay circuit 104 suitably includes a ramp generating circuit 309, a scaling circuit 307, a comparator 314, and a clocked delay circuit 316. In general, a ramp waveform is created at node 305. The ramp is biased in response to delay adjust signal 118 to increase or decrease the average magnitude of the ramp with respect to a threshold voltage of comparator 314. A trigger signal 315 is generated from the relative portions of the ramp waveform that are greater than or less than the threshold voltage, and this trigger signal 315 is provided as a clock input to delay circuit 316 to produce the delayed signal 106 with the desired phase delayed timing.

The ramp waveform 303 at node 305 is any signal capable of producing a suitable trigger signal 315. In one embodiment, ramp waveform 303 is an analog voltage signal that increases and decreases in a periodic manner over time. Such a signal may be readily created in any manner with a suitable ramp generating circuit 309. In the exemplary embodiment shown in FIG. 3, ramp generating circuit 309 includes a capacitor 312 and resistor 310 with parameters selected to create a waveform 303 with approximately linear rising and falling slopes. This can be accomplished, for example, by selecting a capacitor 312 such that the resistor-capacitor (RC) time constant created by capacitor 312 and either resistor 304 or resistor 306 is much greater (e.g. an order of magnitude greater) than the period of input signal 102. In equivalent embodiments, however, ramp waveform 303 need not have linear segments; to that end, any waveform that has periodic rising and falling portions (including any sort of sinusoidal, exponentially increasing/decreasing, sawtooth/serrodyne, and/or other waveforms) could be substituted for a true linear ramp.

Figure 4:
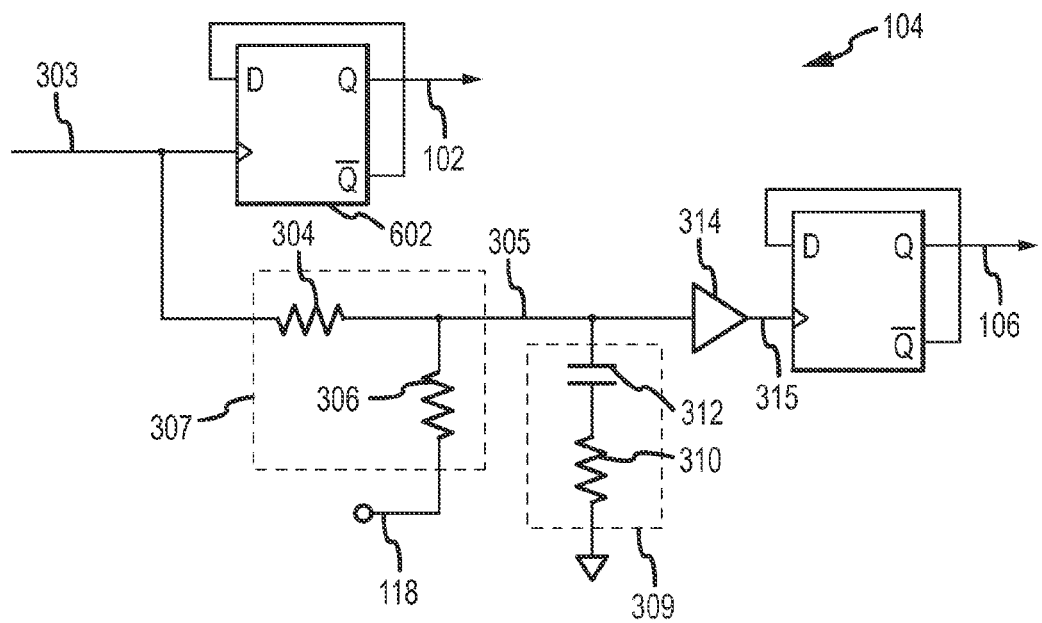
FIG. 4 is a circuit diagram of an alternate embodiment of a programmable phase delay circuit.

In the embodiment shown in FIG. 3, it is generally desirable for ramp waveform 303 to have a frequency that is double the frequency of input signal 102. This can be accomplished with any sort of conventional frequency doubler circuitry 302 as appropriate. In other embodiments, the input signal 102 and the ramp waveform 303 can each be equivalently produced from a double-frequency clock signal 301 as appropriate. With momentary reference to FIG. 4, a clock signal 301 with double the desired frequency of input signal 102 is provided to scaling circuit 304 and to a frequency divider circuit 602 as appropriate. Frequency divider circuit 602 is any sort of latch, flip-flop or other device capable of producing an input signal 102 having the appropriate frequency. In either the FIG. 3 or FIG. 4 embodiment, then, ramp waveform 303, has a frequency that is determined by clock signal 301 which is, in turn, based upon a frequency of input signal 102. The frequency of ramp waveform 303 can therefore be said to be "based upon" the frequency of the input signal 102 in the sense that both frequencies are related to each other by virtue of being harmonics of each other, by being generated from a common signal, and/or by one signal being generated from the other.

Comparator 314 is any sort of device or logic capable of comparing ramp waveform 303 to a threshold level to generate trigger signal 315. In various embodiments, comparator 314 is implemented with a conventional analog comparator circuit, buffer, analog-to-digital converter or the like. The threshold level may be built into comparator 314, or it may be externally supplied as desired. In various embodiments, comparator 314 is a conventional buffer that receives external inputs for supply voltage ($V_{cc}$) and ground, and in such embodiments the threshold level is nominally selected to be the average of the two values (e.g. $V_{cc}/2$), although any other threshold could be used in alternate embodiments. Comparator 314 operates in a manner similar to a single bit analog-to-digital converter in the sense that it receives ramp waveform 303 and produces a trigger signal output 315 that indicates whether the instantaneous value of ramp waveform 303 is greater than or less than the threshold value. That is, trigger signal 315 has one value (e.g. low voltage, ground or "0") when ramp waveform 303 is less than the threshold level, and another value (e.g. high voltage, Vcc or "1") when ramp waveform 303 is greater than the threshold level. This is explained in additional detail below in conjunction with FIGS. 5-6.

The timing of trigger signal 315, then, can be adjusted by adjusting the DC bias of ramp waveform 303 with respect to the threshold level of comparator 314. This can be accomplished with any sort of scaling circuit 307. Scaling circuit 307 is any circuitry or other logic capable of scaling, biasing and/or otherwise adjusting the level of ramp waveform 303 with respect to the threshold level of comparator 314. In the embodiment shown in FIG. 3, for example, scaling circuit 307 is shown as a conventional voltage adder circuit with two resistors 304, 306 joined at a common node 305. In this embodiment, clock signal 303 is provided to node 305 through resistor 304 and delay adjust signal 118 is provided to node 305 through resistor 306. Resistors 304 and 306 may be selected to be relatively large (e.g. on the order of 100 kΩ or so) and approximately equal to each other for simplicity, although other like or unlike values of resistors 304 and 306 could be used in alternate embodiments. If delay adjust signal 118 is designed to be an analog voltage indicative of the amount of delay desired, then changes in adjust signal 118 will result in a DC level change in ramp waveform 303. Ramp waveform 303 can therefore be adjusted with respect to the threshold level of comparator 314 through application of a suitable DC bias from delay adjust signal 118. Adjusting this bias will, in turn, affect the timing of trigger signal 315, which is applied as a clock signal to delay circuit 316.

Delay circuit 316 is any device, circuit or logic capable of generating a delayed output signal 106 in response to trigger signal 315. In various embodiments, delay circuit 316 is a latch, flip-flop and/or other logic as appropriate. As shown in FIG. 3, delay circuit 316 is a conventional D-type flip-flop circuit with a clock input, a data input ("D"), a non-inverting output ("Q") and an inverting output ("/Q"). By simply connecting the inverting output of the flip-flop to the data input, an alternating pulse train is created, with the timing of the pulse train controlled by the applied clock signal. Adjusting the timing of trigger signal 315, then, results in adjustments to the timing of output signal 106. In various embodiments, the clock input of delay circuit 314 is responsive to a rising edge of trigger signal 315, so adjusting the timing of the rising edge of pulses in signal 315 will result in corresponding adjustments in the timing of signal 106.

Figure 5:
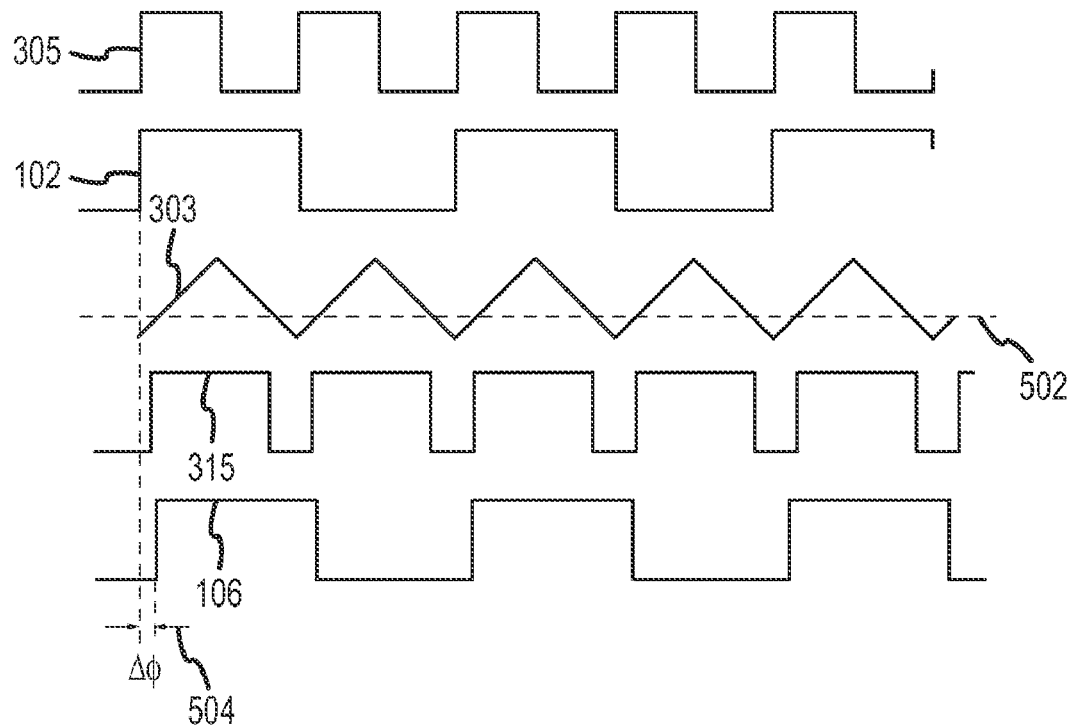
FIGS. 5-6 are timing diagrams showing operation of an exemplary phase delay circuit.
Figure 6:
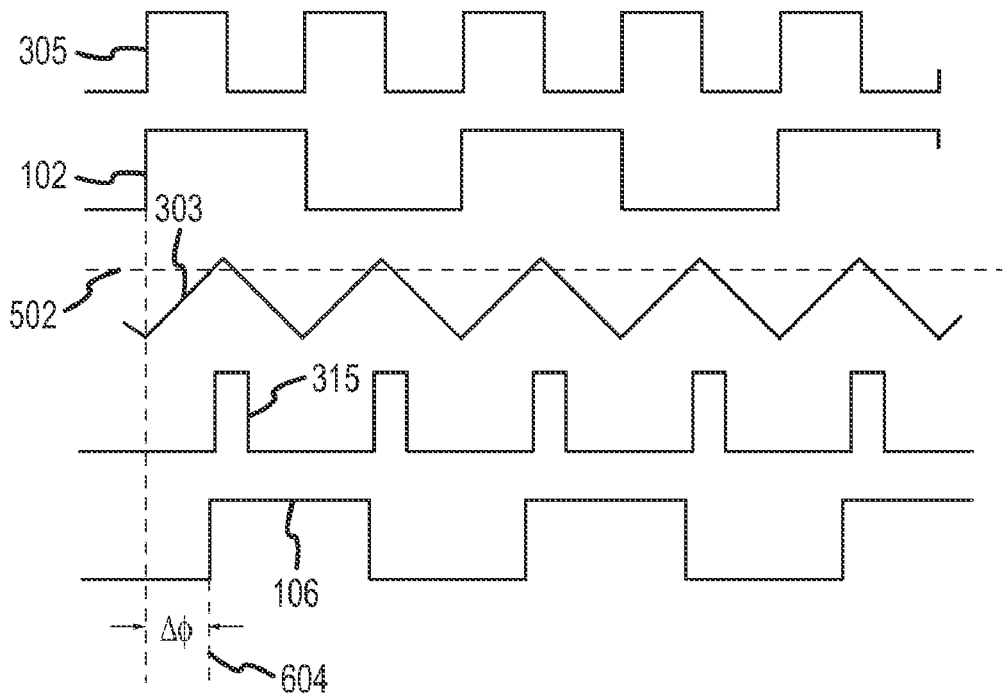

Exemplary operation of delay circuit 104 is described with reference to FIGS. 5-6. FIG. 5 shows operation of circuit 104 to produce a relatively slight amount of delay 504 between signals 102 and 106, whereas FIG. 6 shows a greater amount of programmed delay 604 between the two signals. As noted above, ramp waveform 303 has a frequency that is based upon that of input signal 102, a waveshape that is determined based upon ramp generating circuit 309 (FIG. 3), and a DC bias that is determined from delay adjust signal 118 (FIG. 3). In the embodiments shown in FIGS. 5-6, ramp waveform 303 has a frequency equal to that of clock signal 305, which in turn is based upon the frequency of input signal 102. Trigger signal 315, in turn, is produced by comparing the level of waveform 303 to the threshold level 502 of comparator 314. The DC level of ramp waveform 303 is shown in FIG. 5 to be biased relatively high in comparison to threshold level 502; in FIG. 6, the DC level of ramp waveform 303 is shown biased to a much lower level in comparison to threshold level 502. As a result, the rising edges of trigger signal 315 occur closer to the rising edges of clock 305 in FIG. 5 than in FIG. 6. Stated another way, increasing the DC bias of ramp waveform 303 results in a larger portion of the signal 303 being greater than the threshold level 502, thereby increasing the duty cycle of signal 315 and, more importantly, driving the rising edges of pulses in signal 315 closer to occur more quickly after the rising edges of waveform 303. The rising edges in trigger signal 315, in turn, are used to clock signal 106, thereby producing a programmed delay 504 between signals 102 and 106. As a result, the amount of delay between signals 102 and 106 is adjusted by adjusting the DC bias of ramp waveform 303. In this particular example, the delay is increased when the DC bias is decreased, although this could be differently implemented in other equivalent embodiments.

Returning now to FIG. 1, phase delay circuit 104 is able to create a programmed delay between signals 102 and 106 in response to a driven delay adjust signal 118. By detecting the actual phase delay 109 and accumulating a difference between the measured delay 113 and the delay command 112, an appropriate delay adjust signal 118 can be formulated. That is, the difference between filter output 113 and command signal 112 drives accumulator 116 to a greater or lesser value, which in turn increases or decreases the phase delay applied by delay adjust signal 118. Using conventional feedback and control techniques, then, the delay between signals 102 and 106 can be set to any desired value within the limits of circuit 104.

The concepts set forth herein may be used in any manner to create a variety of useful devices and systems. In the case of an optical phase domain reflectometer, for example, input signal 102 can be used to generate or modulate the light that is injected into an optical fiber or other component, and delayed signal 106 can be used to demodulate the reflected optical signals. In such embodiments, the distance that light travels in the fiber under test can be deduced from the amount of phase delay that results in a suitable demodulating signal 106. Using the concepts, structures and techniques described above, it may be possible to generate finely-tuned phase delays of a nanosecond or less, thereby allowing for very precise measurement of phase delays in reflected signals. Moreover, multiple delay circuits 104 and phase detectors 108 can be used with a single controller 115, thereby allowing for very efficient and effective scalability in environments that demand multiple sensors. Even further, the simple circuitry used to implement phase detector 108 and phase delay circuit 104 can generally be purchased at very low cost and with a very good SWAP efficiency.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A method of creating a delayed digital signal that differs from an input signal having a frequency by a programmable amount of delay, the method comprising the steps of:
   determining an actual phase difference between the input signal and an output signal delayed by the programmable amount;
   providing a delay adjust signal as a function of a difference between a commanded delay and the actual phase difference;
   generating a ramp signal having a ramp signal frequency and an amplitude bias, wherein the ramp signal frequency is based upon the frequency of the input signal and the amplitude bias is based upon the programmable amount of delay;
   comparing the ramp signal to a reference value to create a trigger signal based upon the whether the ramp signal is greater than or less than the reference value;
   applying the trigger signal as a clock to thereby create the delayed digital signal; and
   adjusting the amplitude bias of the ramp signal in response to the delay adjust signal to thereby change the amount of delay between the input signal and the delayed digital signal.

2. The method of claim 1, wherein the generating step comprises doubling the frequency of the input signal.

3. The method of claim 1, further comprising the step of forming the input signal from a clock signal having a frequency that is double the frequency of the input signal, and wherein the ramp signal is also formed from the clock signal.

4. The method of claim 1, wherein the forming step comprises filtering the input signal with a resistor-capacitor circuit to create a ramp waveform.

5. The method of claim 1, wherein the comparing step comprises applying the ramp signal to a buffer.

6. The method of claim 1, wherein the applying step comprises applying the trigger signal as the clock to a flip flop circuit.

7. The method of claim 6, wherein the flip flop circuit has an input, an inverting output and a non-inverting output, and wherein the inverting output is connected to the input, and wherein the non-inverting output provides the delayed digital signal.

8. A delay lock loop system for providing a delayed output signal having a programmed delay from an input signal, the system comprising:
   a phase detector configured to provide a phase delay signal indicative of an actual phase difference between the input signal and the delayed output signal;
   an accumulator configured to provide a delay adjust signal as a function of a difference between a commanded delay and the actual phase difference; and
   a programmable phase delay circuit configured to generate a ramp signal based upon the input signal, to adjust the ramp signal with respect to a threshold level in response to the delay adjust signal, to generate a trigger signal based upon a comparison of the ramp signal with the threshold level, and to clock the delayed output signal in response to the trigger signal.

9. The system of claim 8, wherein the phase detector is an exclusive-OR circuit.

10. The system of claim 8, wherein the accumulator is implemented as a digital accumulator module executed by a digital processor.

11. The system of claim 10, further comprising a filter module executing within the digital processor that is configured to convert the phase delay signal to a digital representation of the actual phase difference.

12. The system of claim 8, further comprising a clock generator configured to produce the input signal at an input signal frequency from a clock signal having a clock frequency that is double the input signal frequency, wherein the clock signal is additionally provided to the programmable phase delay circuit to generate the ramp signal in response thereto.

13. The system of claim 8, wherein the programmable phase delay circuit is configured to produce a programmable phase delay responsive to a command signal in the input signal having a frequency, and further comprises:
   a ramp generating circuit configured to produce the ramp signal having a ramp frequency that is based upon the frequency of the input signal and also having an amplitude;
   a scaling circuit configured to adjust the amplitude of the ramp signal in response to the command signal;
   a comparator configured to receive the ramp signal and produce the trigger signal that is based upon a comparison of the ramp signal to a threshold level of the comparator; and
   a delay circuit having a clock input and a signal output, wherein the clock input is configured to receive the trigger signal and the signal output is configured to provide a delayed representation of the input signal that is clocked in response to the trigger signal.

14. The circuit of claim 13, wherein the ramp generating circuit comprises a resistor and a capacitor.

15. The circuit of claim 13, wherein the scaling circuit comprises a voltage adder.

16. The circuit of claim 15, wherein the command signal is represented as a DC bias applied to the ramp signal by the voltage adder.

17. The circuit of claim 13, wherein the trigger signal comprises a first portion that indicates when the ramp signal is greater than the threshold level and a second portion that indicates when the ramp signal is less than the threshold level.

18. The circuit of claim 13, wherein the delay circuit is a D-type flip-flop.

19. The circuit of claim 13, wherein the delay circuit comprises a signal input and an inverting output in addition to the clock input and the signal output, and wherein the inverting output is coupled to the signal input.

\* \* \* \* \*